Feb. 18, 1958 H. HECHT ET AL 2,824,296

REDUNDANT FAIL-PROOF AMPLIFIER AND ALARM

Filed Sept. 20, 1955

INVENTORS
HERBERT HECHT
CHRISTOPHER POTTLE
BY
R. V. Craddock
ATTORNEY 2,824,296

REDUNDANT FAIL-PROOF AMPLIFIER AND ALARM

Herbert Hecht, Wantagh, N. Y., and Christopher Pottle, New Haven, Conn., assignors to Sperry Rand Corporation, a corporation of Delaware Application September 20, 1955, Serial No. 535,459

12 Claims. (Cl. 340—253)

Figure 1:
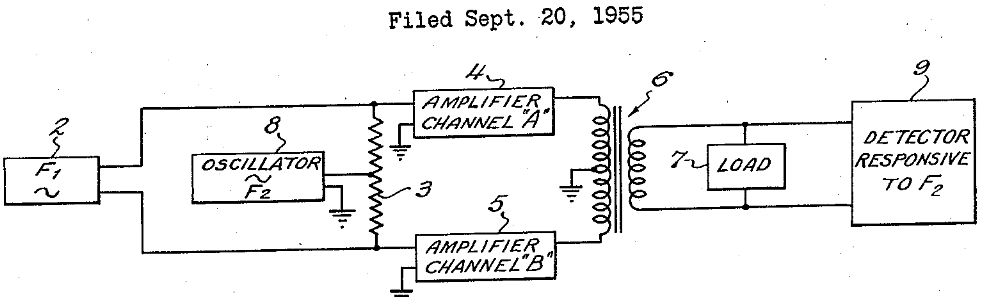

The present invention relates to redundant amplifiers and failure detection means therefor.

Dual-path redundant amplifiers of the redundant type have been constructed for providing an output which is not appreciably changed by a malfunction in one or more amplifier components of one or the other amplifier paths. One such amplifier is disclosed in copending U. S. Patent application, Serial No. 535,367, filed on September 20, 1955, in the names of Herbert Hecht and Christopher Pottle, and is extremely valuable for use in electronic flight control systems. Since most component malfunctions in such an amplifier will not appreciably change the amplifier output, it may be desirable to provide means for indicating that a malfunction exists. Thus, the amplifier could be repaired or replaced before a further component malfunction occurs which, together with the first-mentioned malfunction, might otherwise seriously impair or destroy the amplifier operation.

It is, therefore, an object of the present invention to provide an essentially fail-proof redundant amplifier system including means for readily detecting an amplifier component malfunction even though the amplifier output may not be appreciably affected by the malfunction.

It is a further object of the present invention to provide a failure detector system for a redundant amplifier as aforedescribed which is capable of providing an alarm for malfunctions in either the amplifier or the detector system.

It is yet another object of the invention to provide a failure detector system as aforedescribed for readily providing an indication of a malfunction in any of a large number of redundant amplifiers.

It is a further object of the present invention to provide a fail-safe amplifier as might be used in flight control systems with provisions for readily providing an in-flight check of amplifier operation without interrupting the performance of the amplifier in the system.

The foregoing and other objects and advantages of the present invention, which will become more apparent from the detailed description thereof, are attained by coupling the inputs of a redundant amplifier having dual paths of amplification to a source of oscillator voltage at a frequency appreciably different from the amplifier signal frequency. The oscillator should supply cophasal voltages to the two paths of amplification for a push-pull type amplifier or should supply push-pull voltages to the two paths of amplification for a parallel type amplifier. In the absence of an amplifier component malfunction, voltages at the aforementioned oscillator frequency substantially cancel each other in the redundant amplifier. A detector coupled to the amplifier is provided for detecting a voltage at the oscillator frequency whenever there is a net oscillator voltage in the system attributed to a component malfunction in one or the other amplifier paths. The detector is not responsive to amplifier signal voltages, and, is of the type which gives an alarm when a relay contact is opened. A failure in certain components of either the amplifier or detector causes an opening of the aforementioned relay contacts and, thus, an alarm.

Figure 2:
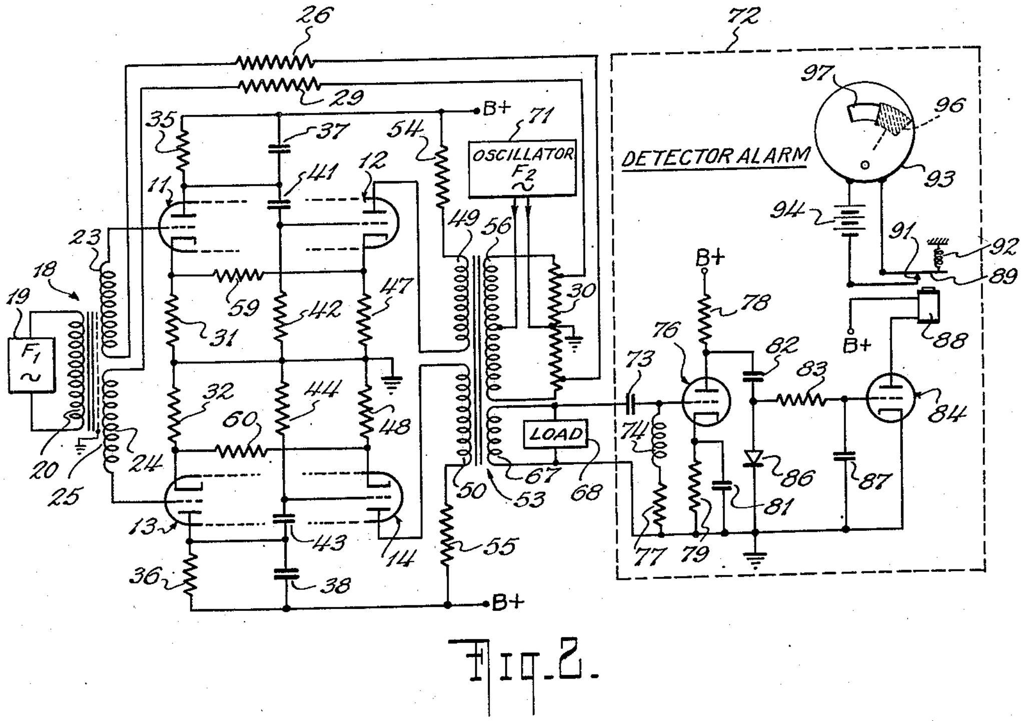
Figure 3:
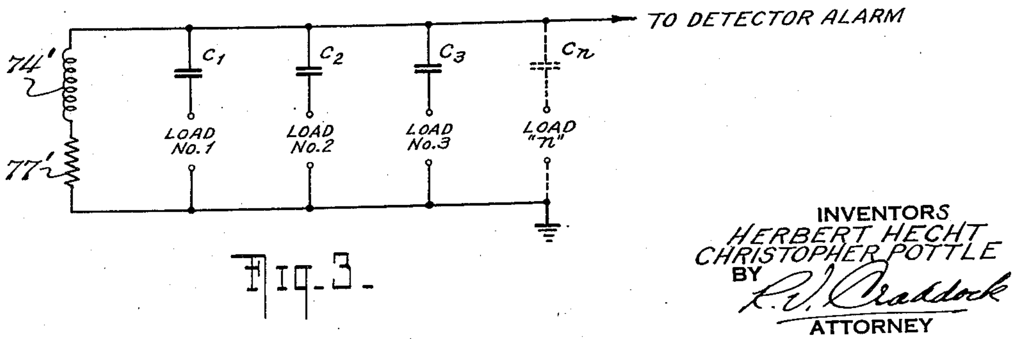

Referring to the drawings,

Fig. 1 is a general schematic diagram of a fail-proof push-pull amplifier and detector system in accordance with the present invention, Fig. 2 is a detailed schematic diagram of a push-pull amplifier in combination with the detector alarm system of the present invention, and Fig. 3 is a schematic diagram of an input circuit for the detector alarm system for monitoring a plurality of redundant amplifiers.

Referring to Fig. 1, the block designated by the numeral 2 refers to a source of push-pull alternating signal voltage at a frequency $F_1$. The numeral 3 designates a center-tapped impedance across which a balanced push-pull voltage from the source 2 is developed for supply to first and second amplifier channels A and B designated by numerals 4 and 5, respectively. The amplifier channels 4 and 5 may comprise a redundant type amplifier as described in the aforementioned application Serial No. 535,367, for example, so that if there is a failure in a component in either channel there will be substantially no change in the push-pull voltage developed across a center-tapped primary winding of an amplifier output transformer 6. The output from the transformer 6 is supplied to a suitable amplifier load 7.

A low impedance oscillator 8 has an output terminal connected to the center-tap of the impedance 3 for supplying the amplifier channels 4 and 5 with equal cophasal voltages at an oscillator frequency $F_2$ of ten times the frequency $F_1$ of the voltage from source 2, for example. If both of the amplifier channels 4 and 5 have a bandwidth including frequency $F_2$ and provide the same degree of amplification and there is no malfunction of a component therein, equal voltages at the frequency $F_2$ will be developed across the center-tapped primary winding of the transformer 6. The aforementioned voltages at the frequency $F_2$ cancel each other in the windings of transformer 6 so that there is no output voltage at the frequency $F_2$ developed at the secondary winding of transformer 6. If there happens to be a component malfunction in one of the amplifier channels 4 or 5, a voltage at the frequency $F_2$ will be developed across the secondary winding of the transformer 6.

A detector 9 is coupled across the aforementioned secondary winding of transformer 6 for response to a voltage at the frequency $F_2$ without being responsive to voltages at the amplifier signal frequency $F_1$ for energizing load 7. The detector 9 is adapted to provide an indication or alarm that one or the other of the amplifier channels 4 or 5 is functioning improperly and a net voltage at the frequency $F_2$ is developed across the secondary of transformer 6.

The arrangement of Fig. 1 comprises a failure detector alarm system for a redundant amplifier of the push-pull type wherein cophasal voltages at the frequency $F_2$ are supplied to the push-pull inputs of the amplifier for cancellation in a push-pull output circuit thereof when equal amplification is provided by each amplifier channel. It is apparent that a failure detector alarm system could be provided under the scope of the present invention for a parallel amplifier circuit wherein a push-pull voltage of the frequency $F_2$ is supplied to the inputs of a pair of amplifiers in parallel for signal voltages at frequency $F_1$, whereby the push-pull voltage of frequency $F_2$ would cancel in the amplifier output whenever equal amplification is provided by each parallel connected amplifier.

A schematic diagram of an actual embodiment of the invention is illustrated in Fig. 2 where numerals 11, 12, 13 and 14 designate four triodes connected together to form a two stage push-pull amplifier. Triodes 11 and 12 may comprise a duo-triode vacuum tube having a separate cathode, grid and plate for each triode all enclosed in a single evacuated envelope. Similarly, triodes 13 and 14 may comprise a duo-triode vacuum tube having a separate cathode, grid and plate for each triode all enclosed in a single evacuated envelope.

An iron core transformer 18 is coupled to the triodes 11 and 13 for supplying the grids thereof with a push-pull voltage from a source 19 of alternating signal voltage for the amplifier at a frequency $F_1$. The transformer 18 has an input winding 20 and a pair of push-pull or balanced output windings 23 and 24 with an electrostatic shield 25 between the input and output windings for reducing the amount of noise coupled to windings 23 and 24. One pair of terminals at points of opposite phase in the windings 23 and 24 are coupled to the grids of triodes 11 and 13. The other pair of terminals for the output windings 23 and 24 are respectively coupled to ground through resistors 26 and 29 of large resistance value and portions of a center-tapped resistor 30 whose function will become more clear below. If desired, the resistors 26 and 29 could be connected between the grids of triodes 11 and 13, respectively, and the aforementioned one pair of terminals of transformer windings 23 and 24, respectively, instead of having the connections illustrated in Fig. 2.

The triodes 11 and 13 are coupled back to back with equal cathode-biasing resistors 31 and 32 coupling the cathodes of triodes 11 and 13 to ground, respectively. The plates of triodes 11 and 13 are coupled through equal load resistors 35 and 36, respectively, to separate sources of similar B+ potential for supplying the plates of triodes 11 and 13 with equal operating potentials. Capacitors 37 and 38 are connected across plate resistors 35 and 36, respectively, for attenuating and shifting the phase of voltages at high frequencies above the region of twenty-five times the frequencies for which the amplifier is designed so as to prevent undesired high frequency oscillations.

The plate of input triode 11 is coupled to the grid of output triode 12 through an R-C coupling network comprising capacitor 41 and resistor 42. Similarly, the plate of input triode 13 is coupled to the grid of output triode 14 through an R-C coupling network comprising capacitor 43 and resistor 44. The aforementioned coupling networks are adapted to supply a balanced push-pull signal voltage to the grids of triodes 12 and 14 from the plates of triodes 11 and 13.

The cathodes of triodes 12 and 14 are coupled to ground through a pair of equal cathode biasing resistors 47 and 48, respectively. The plates of triodes 12 and 14 are coupled to the separate sources of B+ supply voltage indicated in Fig. 2 through a pair of push-pull primary windings 49 and 50, respectively, of an iron core transformer 53. A current limiting resistor 54 is connected between one of the B+ supply voltages and the transformer winding 49. Similarly, a current limiting resistor 55 is connected between the other B+ supply voltage and the transformer winding 50. The resistors 54 and 55 have equal resistance values of considerably smaller magnitude than the resistance values of plate resistors 35 and 36 for triodes 11 and 13. The cathode resistors 47 and 48 should have smaller resistance values than cathode resistors 31 and 32 so as to obtain suitable biasing potentials for the triodes 12 and 14.

The transformer 53 includes a center-tapped secondary winding 56 for deriving a degenerative feedback voltage for the amplifier. The center-tapped resistor 30 is connected across the winding 56 so that any suitable amount of negative feedback can be supplied back to the grids of triodes 11 and 13 by connecting terminals of respective ones of feedback resistors 26 and 29 to opposite points from ground upon the resistor 30.

Since the cathode resistors of triodes 11–14 are un-bypassed, a certain amount of degeneration of the input signal to the grids of these triodes would ordinarily take place. A resistor 59 is coupled between the cathodes of triodes 11 and 12 in one path of amplification for providing enough positive regeneration to compensate for the degeneration brought about by the un-bypassed cathode resistors of triodes 11 and 12. Similarly, a resistor 60 is coupled between the cathodes of triodes 13 and 14 in the other path of amplification for providing enough positive regeneration for compensating for the un-bypassed cathode resistors utilized with the triodes 13 and 14. Resistors 59 and 60 may be of equal resistance value and are chosen so that the amount of positive feedback introduced thereby is well below the point of instability, but, is more than enough to compensate for the un-bypassed cathodes.

In the operation of the system shown in Fig. 2 as an amplifier, an input voltage signal of frequency $F_1$ at the primary winding 20 of transformer 19 is converted into a push-pull voltage and applied to the grids of input triodes 11 and 13, respectively. The push-pull voltage is amplified by triodes 11 and 13, which are adapted to serve as class A amplifiers, and supplied to the grids of triodes 12 and 14 for further class A amplification. An amplified signal output voltage is desired from an output secondary winding 67 of transformer 53 and supplied to a suitable load 68.

The push-pull feedback voltage supplied to the grids of triodes 11 and 13 from resistor 30 is for stabilization purposes. In the event of a malfunction in one of the triodes 11–14 in one path of amplification for the push-pull input signal voltage, the pair of triodes comprising the other path for amplification will be driven harder since there will be less feedback voltage developed at the time of the failure for reducing the net signal voltage supplied to the grid of the input triode of the operating path of amplification. Thus, the output voltage across winding 67 can be made to be substantially independent of a failure or failures in one or the other paths of amplification. One circuit has been constructed for operation at 400 cycles per second wherein there is less than a 10% change in the voltage gain of the output signal supplied to load 68 from output winding 67 whenever one of the paths of amplification fails.

The amplifier of Fig. 1 is extremely reliable and rugged and substantially unaffected by any failure in a tube or component therewith. For example, if there were to be grid-to-cathode or grid-to-plate short in either of input triodes 11 or 13, one of the feedback resistors 26 and 29 would prevent a short of the input transformer 18 which would otherwise destroy the output provided by the amplifier. The resistors 54 and 55 in series with the plates of the output triodes 12 and 14 serve two purposes. In the event of a plate-to-cathode short or a plate-to-grid short in an output triode 12 or 14, the shorted triode offers very little resistance to current flow. A resistor such as 54 or 55, depending upon which tube is shorted, then becomes a current limiting resistance for the tube's power supply and prevents short circuiting of a primary winding of the output transformer 53. In the event of such a short in one of triodes 12 or 14, the resistor 54 or 55 connected to the shorted triode is across one primary of the output transformer. The resistance values of resistors 54 and 55 may be optimized for maximum power output with a short or failure in one of triodes 12 or 14 in accordance with the disclosure in the aforementioned copending application Serial No. 535,367, if desired.

Since the aforedescribed amplifier is essentially fail proof, it is highly desirable to provide some means for detecting a component failure so that the amplifier can be repaired or replaced before a further component failure occurs which, together with the first-mentioned failure, might impair or destroy the amplifier operations. The remaining part of the circuit shown in Fig. 2 is for this purpose.

The numeral 71 designates a low impedance oscillator for generating an alternating voltage at a frequency $F_2$ of the order of ten times the amplifier signal frequency $F_1$, frequency $F_2$ being within the amplifier bandwidth. The oscillator 71 is preferably of a very stable type, such as a resistance-capacitance phase shift oscillator, and should have a low output impedance compared with the resistance of the resistor 30.

The output of the oscillator 71 is coupled between the center tap of the secondary winding 56 of transformer 53 and the grounded midpoint of resistor 30. Since the voltage from oscillator 71 is supplied to the center-tap of winding 56, the magnetic flux in each half transformer winding 56 caused by the currents at the frequency $F_2$, oppose each other so that there is no coupling back to the primary windings 49 and 50 of transformer 53. Cophasal voltages of frequency $F_2$ are derived between the above ground terminals of resistor 30 and supplied back through the feedback resistors 26 and 29 to the inputs of triodes 11 and 13 so as to be of equal amplitude. If the two paths of amplification of the push-pull amplifier are both functioning properly, the resultant cophasal voltages at frequency $F_2$ at the outputs from the plates of triodes 12 and 14 are equal. The current flow through the primary windings 49 and 50 of transformer 53 for such an output will be equal and in opposite directions so that the magnetic fluxes of windings 49 and 50 cancel each other and there can be no output at the frequency $F_2$ generated across the transformer output winding 67. If, for some reason one of the paths of amplification of the aforedescribed amplifiers contains one or more malfunctioning components so that the amplification therein is not as large as the other path, the currents at the frequency $F_2$ through the balanced windings 49 and 50 will no longer be of equal magnitude. Therefore, a voltage will be induced across the output winding 67 at the frequency $F_2$ for delivery to a tuned detector indicated by block 72.

The detector 72 has a resonant input circuit comprising a capacitor 73 and inductor 74 tuned to the frequency $F_2$. The junction between capacitor 73 and inductor 74 is coupled to the grid of a triode amplifier 76. The terminal of inductor 74 remote from the grid of triode 76 is coupled to ground through a resistor 77, which may be selected for obtaining a bandwidth of the resonant circuit compatible with the stability of oscillator 71.

The plate of the triode amplifier 76 is coupled to a source of B+ voltage supply through a load resistor 78. The cathode of the triode 76 is coupled to ground through a cathode biasing resistor 79 bypassed at the frequency $F_2$ by a capacitor 81.

A serially connected capacitor 82 and resistor 83 are connected between the plate of triode 76 and a further triode 84. The junction terminal between the capacitor 82 and resistor 83 is coupled to ground through a rectifier 86 whose anode side is designated by the arrowhead in Fig. 2. The grid of the tube 84 is connected to ground through a capacitor 87.

The cathode of tube 84 is grounded, the plate thereof being coupled through a relay winding 88 to a source of B+ voltage supply for operating the tube 84. The tube 84 is designed so that it is ordinarily conducting with no bias on the grid thereof. The current through tube 84 passes through the winding 88 and provides a magnetic flux for maintaining a relay armature 89 in a closed position with respect to terminal 91 against the force of a spring 92. This completes a circuit for a meter 93 having a battery 94 for supplying a current for energizing a magnetically operated warning flag 96 to prevent it from being seen through the meter window 97. A magnetically operated meter as aforedescribed is conventional in the art so needs no detailed description, it being operated so that when the contact between armature

89 and terminal 91 is broken the warning flag 96 is swung into position so as to be visible through window 97.

In operation of the detector alarm 72, whenever there is a voltage provided at the output transformer winding 67 at the frequency $F_2$, it is amplified by the triode 76 and supplied as a negative biasing voltage to the grid of the tube 84. This occurs because the elements 82 and 86 are chosen so that on positive half cycles of the plate voltage of triode 76, the capacitor 82 is charged almost immediately through rectifier 86, whereas on negative half cycles, the capacitor 82 is discharged only a small amount. Thus, the average voltage at the junction between capacitor 82 and 86 is negative with an alternating voltage output from triode 76. The circuit comprising resistor 83 and capacitor 87 acts as a smoothing circuit whereby a substantially unidirectional negative voltage is maintained at the grid of tube 84 to bias it below cut-off when triode 76 is providing an output. Thus, whenever the current through tube 84 and relay winding 88 ceases, the switch contacts 89 and 91 of the relay are opened and the flag 96 of indicator 93 will move to a position so as to be visible through window 97 and provide an indication that there is a component malfunction somewhere in the amplifier. It can readily be seen that the indicator 93 will also provide an indication of a malfunction in most components of the detector alarm since the relay contacts 89 and 91 must be closed with triode 84 conducting for preventing the flag 96 from being visible.

It may be desirable to monitor a large number of amplifiers of the type shown in Fig. 2 for detecting a component malfunction therein. Therefore, the tuned input circuit to the detector shown in Fig. 2 may take the form illustrated in Fig. 3. The various loads in Fig. 3 refer to respective loads for different redundant amplifiers, the letter "*n*" referring to the total number of loads. The letters $C_1$, $C_2$ and $C_3$ refer to respective capacitors for each of the loads, $C_n$ referring to the total parallel capacitance of the circuit. It can be readily seen that total capacitance $C_n$ shown in Fig. 3 can be easily designed for resonance with inductor 74' at the frequency $F_2$ for monitoring a large number of amplifiers while providing no effect on amplifier operation.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

What is claimed is:

1. In combination, a dual-path amplifier having input means for receiving an alternating voltage signal of a first frequency for amplification, an output for said amplifier, means coupled to said amplifier for supplying alternating voltages to the dual paths thereof at a second frequency appreciably different from said first frequency, the phase relationship of the voltages of said second frequency applied to the dual paths being predetermined for cancellation at said output under conditions of equal amplification through the dual paths of said amplifier, and detector means coupled to said output of said amplifier and responsive to voltages of said second frequency, said detector means being adapted to provide an alarm in response to a net voltage at said second frequency at said amplifier resulting from a malfunction at one or the other of said amplifier paths.

2. The combination set forth in claim 1, wherein said detector means includes a relay winding and a grid controlled vacuum tube having an output in series with said relay winding, and means coupled to the grid of said vacuum tube for biasing said tube below cut-off in the presence of an alternating voltage of said second frequency supplied to said detector means from said amplifier.

3. The combination as set forth in claim 2, further including a relay armature connected to a relay contact terminal at a time when said vacuum tube is conducting current, and an indicator coupled between said relay armature and said contact terminal for providing an alarm indication whenever the connection between said relay contact terminal and armature is opened at a time when said vacuum tube is biased below cut-off.

4. The combination as set forth in claim 1, wherein said detector means includes a meter having a source of current for operation of said meter in a first state for providing an indication that a substantially zero net voltage at said second frequency is provided by said amplifier, said detector means including a gating circuit responsive to a net voltage at said second frequency provided by said amplifier for cutting off said meter current and operation of said meter in a second state for providing an alarm indication.

5. The combination as set forth in claim 1, wherein said amplifier is of the push-pull type having push-pull input winding means and a push-pull output circuit, push-pull feedback winding means coupled to said output circuit for feeding back a degenerative stabilizing push-pull voltage to said input winding means, and a low impedance oscillator coupled to the electrical mid-point of said push-pull feedback winding means for supplying cophasal voltages of said second frequency to said amplifier input winding means.

6. An essentially failure-proof amplifier system, comprising a push-pull amplifier having first and second paths of amplification and a balanced output circuit connected to said first and second paths of amplification for providing an amplified output version of an input signal voltage at a first frequency, means coupled to said amplifier for providing degenerative feedback therein so that amplification of said input signal voltage is substantially independent of a malfunction in one or the other of said paths of amplification, a low-impedance oscillator coupled to said amplifier for supplying cophasal voltages of equal amplitude and a second frequency appreciably different from said first frequency to said first and second paths of amplification for cancellation in said amplifier under conditions of equal amplification through said paths, and a detector responsive to voltages of said second frequency, said detector being coupled to said amplifier for providing an alarm in response to unequal amplification of said cophasal voltages of said second frequency by said first and second paths of amplification.

7. An amplifier system as set forth in claim 6, wherein said detector comprises a relay coupled to the output of a grid controlled vacuum tube, a tuned detector input circuit resonant to said second frequency, and grid biasing means between said last-named circuit and the grid of said vacuum tube for biasing said tube below cut-off in response to a voltage supplied to said tuned input circuit having said second frequency.

8. A detector alarm circuit for providing an alarm indication of the presence of an input alternating voltage at a predetermined frequency, comprising an input circuit responsive to said predetermined frequency, a meter having a source of current in series with an armature switch member for operation in a first state for providing an indication that substantially zero net voltage at said predetermined frequency is present at said input circuit, a relay for operating said armature-switch member, means coupled between said relay and said input circuit for energizing said relay and operating said switch member and meter in said first state in the presence of a zero net input alternating voltage, said last-mentioned means being responsive to an input voltage of a predetermined magnitude for de-energizing said relay and operating said switch member for cutting off said meter current for operation of said meter in a second state for providing an indication of the presence of a voltage input at said predetermined frequency.

9. A detector alarm circuit as set forth in claim 8, wherein said input circuit comprises a resonant inductor-capacitor circuit.

10. A detector alarm circuit as set forth in claim 8, wherein said input circuit is resonant to said predetermined frequency and comprises a plurality of capacitors in parallel with each other, each capacitor having a first terminal coupled to a first terminal of inductor means for resonance therewith, a plurality of sources of voltage at said predetermined frequency, and a plurality of input terminals coupled to said sources, said last-named terminals comprising second terminals of respective ones of said capacitors and a second terminal for said inductor means.

11. A fail-proof amplifier-detector system for providing an output voltage at a signal frequency while detecting for a malfunction in an amplifier component even through the amplifier signal output voltage is not appreciably affected by such a malfunction, said system comprising; a push-pull amplifier having first and second grid-controlled amplifier tubes coupled together for providing one amplifying path and third and fourth grid-controlled amplifier tubes coupled together for providing another amplifying path in push-pull relationship with said first path, an input transformer having balanced secondary windings coupled to the grids of said first and third tubes for supplying a push-pull signal voltage thereto, an output transformer having balanced primary windings connected to the plates of said second and fourth tubes for deriving a push-pull amplifier signal voltage therefrom, push-pull feedback winding means coupled to said last-mentioned windings for supplying a degenerative push-pull feedback voltage to the grids of said first and third tubes, an oscillator for providing an output voltage of a frequency appreciably different from said amplifier signal frequency, said oscillator having its output coupled between an electrical midpoint of said push-pull feedback winding and ground, a further transformer winding coupled to the pair of primary windings connected to the plates of said second and fourth tubes, an amplifier signal load coupled across said further transformer winding, and a detector responsive to the frequency of said oscillator, said detector being coupled across said load for providing an indication of a failure in a component of said amplifier resulting in unequal amplification in said first and said second amplifier paths.

12. A fail-proof amplifier detector system as set forth in claim 11, wherein said detector includes a resonant input circuit tuned to said oscillator frequency and relay means in series with vacuum tube control means for regulating current through said relay means, said control means being coupled to said resonant input circuit and responsive to a voltage therefrom at said oscillator frequency for cut-off of said vacuum tube control means, and an alarm circuit coupled to said relay means for providing an indication of current cut-off through said relay means.

References Cited in the file of this patent

UNITED STATES PATENTS

| | | |
|---|---|---|
| 2,605,333 | Job | July 29, 1952 |
| 2,703,877 | Stoff et al. | Mar. 8, 1955 |